(12) United States Patent
Mutz et al.

(10) Patent No.: US 7,740,465 B2
(45) Date of Patent: Jun. 22, 2010

(54) CASTING MOLD FOR PRODUCING AN OPTICAL SEMICONDUCTOR MODULE

(75) Inventors: Dieter Mutz, Heilbronn (DE); Hans-Peter Waible, Flein (DE)

(73) Assignee: Atmel Automotive GmbH, Heilbronn (DE)

( * ) Notice: Subject to any disclaimer, the term of this patent is extended or adjusted under 35 U.S.C. 154(b) by 75 days.

(21) Appl. No.: 11/366,482

(22) Filed: Mar. 3, 2006

(65) Prior Publication Data

US 2006/0196412 A1 Sep. 7, 2006

(30) Foreign Application Priority Data

Mar. 3, 2005 (DE) .................. 10 2005 010 311

(51) Int. Cl.
*B29C 45/14* (2006.01)
*H01L 21/56* (2006.01)

(52) U.S. Cl. .................. 425/116; 425/125; 425/577

(58) Field of Classification Search .................. 425/116, 425/125, 129.1, 577
See application file for complete search history.

(56) References Cited

U.S. PATENT DOCUMENTS

| | | | |
|---|---|---|---|
| 4,651,083 A | | 3/1987 | Lachmann et al. |
| 4,663,833 A | * | 5/1987 | Tanaka et al. .......... 264/272.17 |
| 4,894,707 A | * | 1/1990 | Yamawaki et al. .......... 257/680 |
| 5,438,216 A | * | 8/1995 | Juskey et al. ................ 257/434 |
| 5,622,873 A | * | 4/1997 | Kim et al. ..................... 438/65 |
| 5,811,799 A | | 9/1998 | Wu |
| 6,441,503 B1 | * | 8/2002 | Webster ....................... 257/787 |
| 6,624,491 B2 | * | 9/2003 | Waitl et al. .................. 257/434 |
| 7,205,175 B2 | * | 4/2007 | Raben .......................... 438/65 |
| 2002/0093120 A1 | | 7/2002 | Magni et al. |
| 2004/0114486 A1 | | 6/2004 | Tanase |
| 2004/0238909 A1 | | 12/2004 | Boon et al. |

FOREIGN PATENT DOCUMENTS

| | | |
|---|---|---|
| EP | 0 169 388 A1 | 1/1986 |
| EP | 0 789 334 A2 | 8/1997 |
| EP | 813236 A1 * | 12/1997 |
| EP | 1 220 309 A1 | 7/2002 |
| EP | 1 441 424 A1 | 7/2004 |
| WO | WO 03/028086 A1 * | 4/2003 |
| WO | WO 03028086 A1 * | 4/2003 |

* cited by examiner

*Primary Examiner*—Robert B Davis
(74) *Attorney, Agent, or Firm*—Muncy, Geissler, Olds & Lowe, PLLC

(57) ABSTRACT

A method and a casting mold for producing an optical semiconductor module is provided, wherein a semiconductor body having at least one optically active element on its top is introduced into a leadframe. Then conductive connections are established between the semiconductor body and the leadframe, and then the leadframe and semiconductor body are encapsulated in a casting mold. Wherein provided in the part of the casting mold that faces the top of the semiconductor body are masking bodies, which extend from the top inner wall of the casting mold towards the optically active elements and cover the elements with their respective end face in a way that seals out casting material.

8 Claims, 3 Drawing Sheets

CASTING MOLD FOR PRODUCING AN OPTICAL SEMICONDUCTOR MODULE

This nonprovisional application claims priority under 35 U.S.C. §119(a) on German Patent Application No. DE 102005010311, which was filed in Germany on Mar. 3, 2005, and which is herein incorporated by reference.

BACKGROUND OF THE INVENTION

1. Field of the Invention

The present invention relates to a casting mold for producing an optical semiconductor module, wherein a semiconductor body having at least one optically active element on its surface is introduced into a leadframe, then conductive connections are established between the semiconductor body and the leadframe, and then the leadframe and semiconductor body are encapsulated in a casting mold.

2. Description of the Background Art

Manufacturing methods are known, in which an optical IC (PDIC) is encapsulated in a transparent casting material or is placed on an organic substrate and then covered with a casting material. The casting material must be transparent in order to permit radiation in the optical range to pass to or from the optically active element. In this connection, the casting material must be matched to the wavelength range in which the optical element transmits or receives. In addition, the casting material must have temperature stability, long-term stability, and be moisture-resistant.

Such casting materials are relatively expensive, and problems regularly occur with the optical transparency.

SUMMARY OF THE INVENTION

It is therefore an object of the present invention to provide a method for producing an optical semiconductor module in which an economical casting material can be used and the desirable optical characteristics of the semiconductor module are achieved.

The inventive method makes it possible to produce, in an especially simple and economical way, a semiconductor that on the one hand is encapsulated, and thus protected from environmental influences such as vibrations and moisture, but on the other hand in which the corresponding casting material is excluded in the area where light is to be received or transmitted.

By this method, a more economical casting material, for example an epoxy resin that is not optically transparent, can be used, resulting in great cost savings. The casting materials used can thus also be selected according to criteria other than optical transmission, thereby additionally permitting the module to be optimized for other requirements as well.

Preferably the masking bodies must be chosen of such a size that they leave open adequate areas of the semiconductor body. In this context, each optically active element on the semiconductor body can have its own associated masking body, or several of the optically active elements can be covered jointly by one masking body.

After the casting material has been cast and largely solidified, each mold can be opened and the masking bodies can be removed together with the part of the mold facing the top of the semiconductor body. During the casting process, the end faces of the masking elements are pressed against the semiconductor bodies in such a manner that the thin-bodied casting material cannot penetrate between the end face of the masking body and the corresponding region of the semiconductor body.

The semiconductor body can be elastically held in a leadframe, so that when the masking bodies have appropriate lengths they can push the semiconductor body back a distance against the elastic force, thus producing the appropriate contact force.

In an embodiment, if the top of the semiconductor body as a whole is covered with a polyimide layer prior to encapsulation, with the regions of the optically active elements left open. The polyimide layer helps to reduce the thermal stress on the semiconductor body in the emerging cast body, and makes the semiconductor module more thermally stable, and thus usable at higher temperatures. This is especially important when the semiconductor module is to be further processed or connected to other circuit units using the lead-free soldering method, since the solders used in lead-free soldering require a soldering temperature that is increased by approximately 20° C. under otherwise equivalent joining conditions.

With regard to its external structure, the casting mold corresponds largely to a casting mold that is for elastic leadframes of the QFN type (quad flat non-leaded package), wherein the masking bodies are additionally arranged on and attached to an interior wall. Such casting molds are typically made of steel, and the masking bodies may be connected to the mold as a single piece.

Typically the masking bodies may be designed as cylindrical rods, but they may also have a slight conical taper or a cross-section that is reduced in a stepwise, conical, or convex or concave manner toward the semiconductor body; this facilitates final forming after the casting process. In any case, they have an end face that can be pressed against the semiconductor body. In cross-section, the masking bodies may be round or polygonal, preferably rectangular, in design. Even in rectangular form, the masking bodies can taper conically toward the semiconductor body in order to facilitate demolding.

In order to facilitate sealing of the optically active areas of the semiconductor body requiring protection by the masking body end faces, provision can be made that said bodies have on their end face a raised edge that is flat around its circumference and forms a sealing edge with respect to the semiconductor body. Recessing the actual end face behind this edge also effectively prevents the casting material from being drawn into the intermediate space between the semiconductor body and the masking body by capillary action.

The resulting semiconductor module is characterized by its simple design and low price, a result of the simple encapsulation while leaving the optically active areas open. The corresponding recesses in the casting material make possible the emission and reception of optical signals. As a result of a polyimide coating on the semiconductor body, the inventive semiconductor module is particularly temperature-stable.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
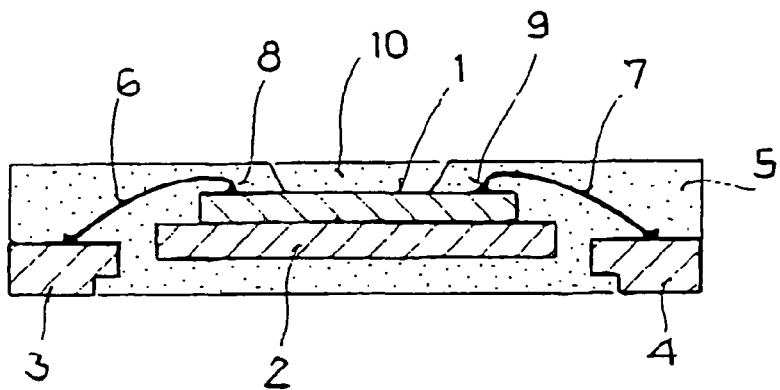
FIG. 1 shows an encapsulated semiconductor module in cross-section.

In the drawings, like or functionally like elements and signals are identified with the same reference labels, unless otherwise specified.

FIG. 1 shows a cross-section of an encapsulated semiconductor module in which a semiconductor body 1 is attached to a substrate 2 and this unit is elastically mounted on a leadframe whose parts are labeled 3, 4. The casting material, which typically is an epoxy resin, is labeled 5. The parts 3, 4 of the leadframe each have separate, individual contacts, which are connected by bond wires 6, 7 to respective bond areas 8, 9 of the semiconductor body. After encapsulation and curing of the semiconductor module, the individual contacts 3, 4 are produced by sawing from a contiguous metal body. Prior to the manufacture of the semiconductor module, the metal body has a contiguous frame of uniform material, for example copper, in which areas are formed by etching or pre-punching where the individual contacts can be separated simply later. In this way, this frame is simple to process but can nevertheless be divided after casting into numerous individual parts that are electrically insulated from one another.

FIG. 1 shows that the semiconductor body 1 is only partially covered by the casting material 5. An open space 10 remains, in which optically active elements can be arranged, which can then emit or receive radiation without being hindered by the casting material 5.

Not shown in the figure is a thin polyimide layer coating the semiconductor body 1, with the exception of the region 10 and the regions 8, 9, where bonding will later take place.

The substrate 2 can be composed of, for example, a ceramic, an organic material, or even a metal. Conductivity is of no importance here, since the electrically active zone of the semiconductor body is located solely on its top side.

Figure 2:
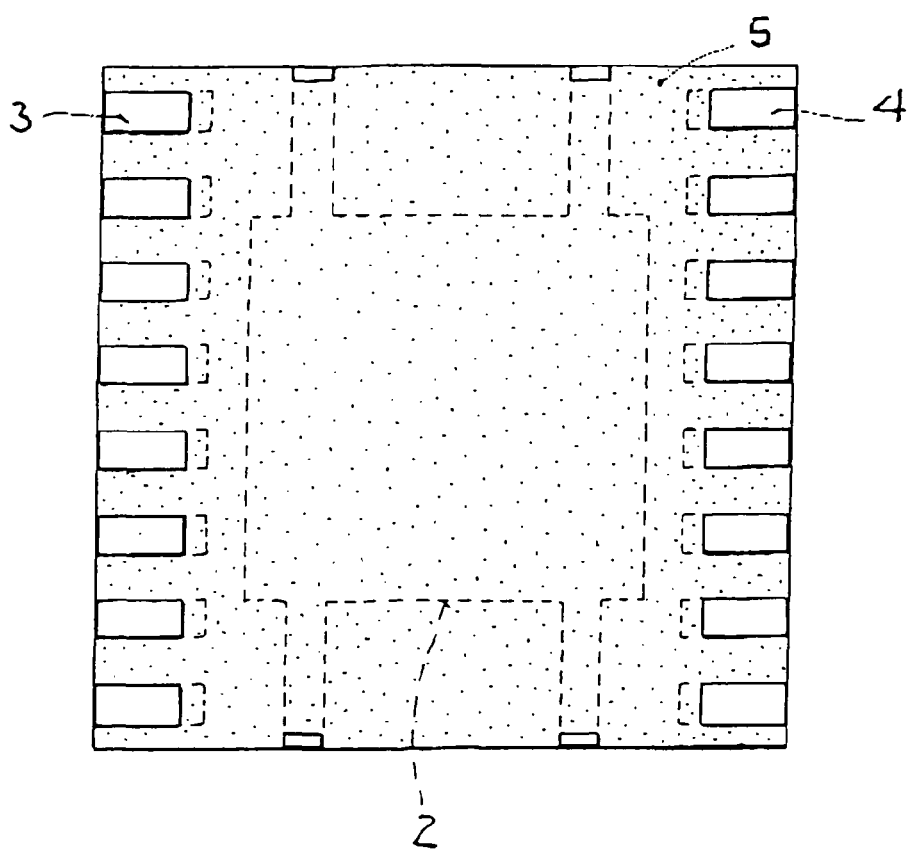
FIG. 2 shows the module from FIG. 1 in a view from below.

FIG. 2 shows the semiconductor module from FIG. 1 in a view from below, where the separated contacts 3, 4 are exposed and visible.

Figure 3:
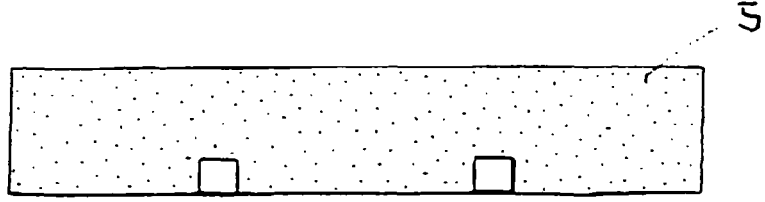
FIG. 3 shows a side view of the module from FIGS. 1 and 2.

FIG. 3 shows an outside view of the semiconductor module from the front.

Figure 4:
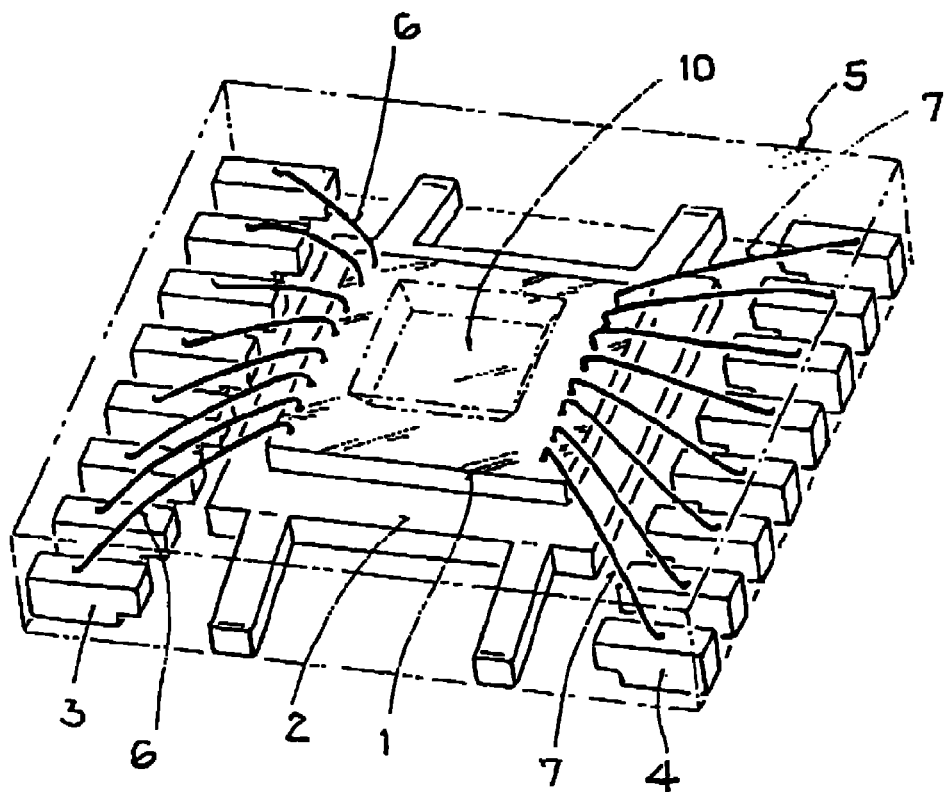
FIG. 4 shows a perspective, partially cutaway view of the semiconductor module from FIG. 1.

Shown in FIG. 4 is a three-dimensional view of the semiconductor module, in which the casting material is shown transparent such that the bond wires 6, 7 and the parts of the leadframe are visible. The bond wires lead to the semiconductor body 1, where they end at bond areas 8, 9. In the casting material is shown a recess 10, which leaves the optically active elements of the semiconductor body 1 free in order to emit and receive optical radiation.

Figure 5:
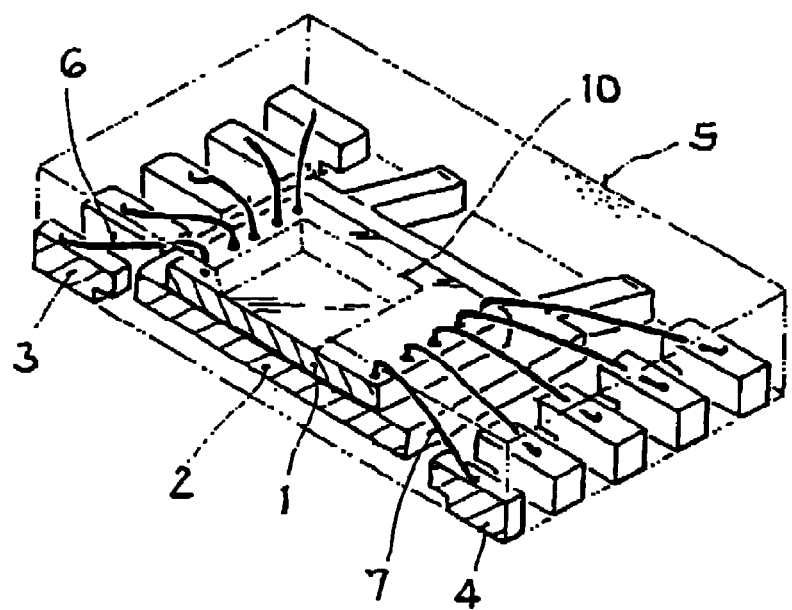
FIG. 5 shows a cross-sectional perspective view of the module from FIG. 1.

FIG. 5 shows the semiconductor module from FIG. 4 in a three-dimensional, cross-sectional view.

Figure 6:
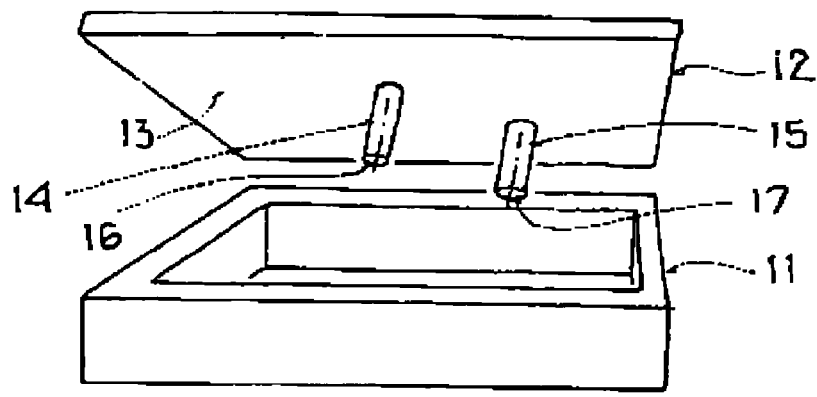
FIG. 6 shows a perspective view of a casting mold for a semiconductor module in a schematic representation.

A casting mold 11, 12 for the semiconductor module is shown schematically in FIG. 6. Typically, a large number of such casting molds are combined in order to produce as many semiconductor modules as possible in a single casting step, although the figure shows only one individual mold, which includes a bottom part 11 and a top part 12. On its inner side 13, the top part 12 bears two masking bodies 14, 15, which are designed as cylindrical rods with end faces 16, 17.

After placement on the substrate of the leadframe and semiconductor body, which have already been bonded together, the casting mold is first closed. As this is done, the end faces 16, 17 of the masking bodies 14, 15 strike the semiconductor body and cover the optically active areas on it. After the casting mold has been closed, the epoxy resin, which has a low viscosity at high temperatures, is then injected through an inlet opening as the casting material until the interior volume of the casting mold 11, 12 is filled. After solidification of the casting resin, the top of the casting mold 12 is removed and the masking bodies 14, 15 are withdrawn from the hardened epoxy resin. There remain openings in the casting resin that extend to the semiconductor body, where they expose the optically active areas.

Figure 7:
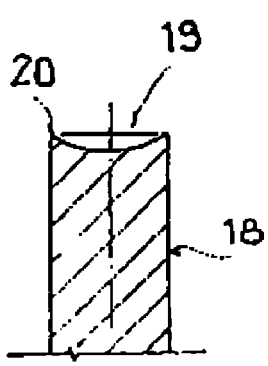
FIG. 7 shows a cross-section through a masking body with a cylindrical shape.

FIG. 7 shows a longitudinal section of a cylindrical masking body 18, which has an end face 19 with a basin-like indentation whose edge 20 is flat around its circumference and forms a sharp edge that constitutes a cover that seals casting material away from the semiconductor body during casting.

Figure 8:
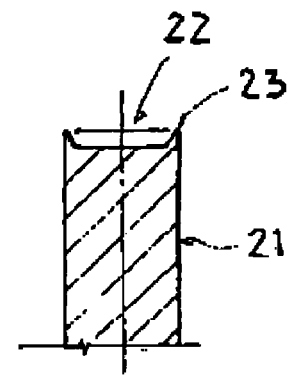
FIG. 8 shows a cross-section through a cylindrical masking body which has a circumferential ridge on its end face.

FIG. 8 shows another masking body 21, which is likewise cylindrical and which has on its end face 22 a circumferential ridge 23, which forms a sealing surface with respect to the semiconductor body.

Figure 9:
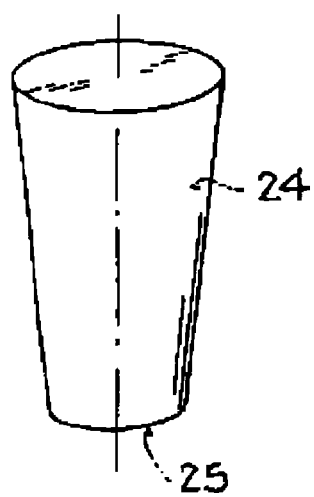
FIG. 9 shows a perspective view of a masking body with a truncated conical shape.
Figure 10:
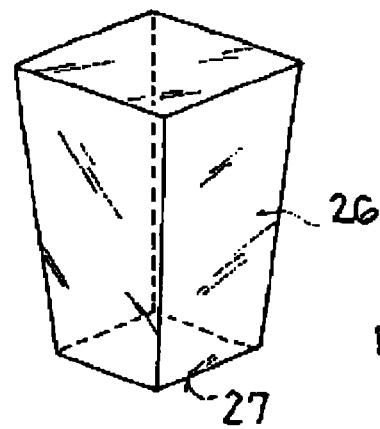
FIG. 10 shows a perspective view of a masking body with a truncated pyramid shape.

FIG. 9 shows a conically tapering truncated cone 24, which has a flat end face 25 for placement on the semiconductor body, while FIG. 10 shows a truncated pyramid 26 that is rectangular in cross-section with a flat end face 27.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A casting mold for producing an optical semiconductor module, the casting mold comprising:

an inner wall that faces an upper surface of a semiconductor body; and at least one masking body extending from the inner wall, the masking body having an end face that extends towards the upper surface of the semiconductor body such that casting material is excluded in an area where light is to be received or transmitted to or from the optical semiconductor module, wherein the semiconductor body is elastically held in a lead frame such that the masking body elastically deforms the lead frame, and wherein the end face of the masking body has an edge that is configured to form a seal between the masking body and the semiconductor body to exclude the casting material.

2. A casting mold according to claim 1, wherein the masking body has an unchanging cross-sectional area along its length.

3. The casting mold according to claim 1, wherein the masking body has a cross-section that reduces along its length toward the semiconductor body in a stepwise, conical, convex, or concave manner.

4. The casting mold according to claim 1, wherein the masking body has a substantially circular cross-section.

5. The casting mold according to claim 1, wherein the masking body has a rectangular cross-section.

6. The casting mold according to claim 1, wherein the end face of the masking body has a flat, projecting circumferential edge, behind which an interior region of the end face is recessed.

7. A casting mold for producing an optical semiconductor module, the casting mold comprising:
- an inner wall that faces an upper surface of a semiconductor body; and
- at least two masking bodies, each of the masking bodies extending from the inner wall, and each of said masking bodies having an end face that extends towards the upper surface of the semiconductor body, the masking bodies covering optically active elements of said semiconductor body when said mold is cast,
- wherein the semiconductor body is elastically held in a lead frame such that the masking body elastically deforms the lead frame.

8. A casting mold holding a semiconductor device in a position for being at least partially encapsulated by a casting material,
- the casting mold comprising a first mold part having an interior and a second mold part having at least one projection, the casting mold having a first configuration in which the first mold part is spaced from the second mold part to provide access to the first mold part interior and a second configuration wherein the first mold part and the second mold part define a cavity and the at least one projection projects into said cavity;
- the semiconductor device including a semiconductor body having an optical element and a lead frame having a plurality of elastic elements supporting the semiconductor body on the lead frame;
- the semiconductor device being supported in the first mold part with the optical element positioned a first distance from a wall of the first mold part when the casting mold is in the first configuration and the semiconductor device being supported in the first mold part with the optical element positioned a second distance less than said first distance from the wall of the first mold part when the casting mold is in the second configuration with the at least one projection in contact with the optical element, the at least one projection biasing the optical element toward the wall.

* * * * *